(12) United States Patent
Wang et al.

(10) Patent No.: US 11,573,666 B2
(45) Date of Patent: Feb. 7, 2023

(54) DISPLAY DEVICE WITH TOUCH CONTROL WIRING LIENS HAVING HOLE PATTERNS AND METHOD OF MANUFACTURING THEREOF

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Jing Wang, Beijing (CN); Lingyan Wu, Beijing (CN); Taofeng Xie, Beijing (CN); Xiaodong Xie, Beijing (CN); Min He, Beijing (CN); Dong Li, Beijing (CN); Qin Zeng, Beijing (CN); Wei Zhang, Beijing (CN); Qitao Zheng, Beijing (CN); Xiao Han, Beijing (CN); Qidi Wu, Beijing (CN); Yaying Li, Beijing (CN); Shuncheng Zhu, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 837 days.

(21) Appl. No.: 16/339,944

(22) PCT Filed: Oct. 11, 2018

(86) PCT No.: PCT/CN2018/109782
§ 371 (c)(1),
(2) Date: Apr. 5, 2019

(87) PCT Pub. No.: WO2019/072204
PCT Pub. Date: Apr. 18, 2019

(65) Prior Publication Data
US 2021/0373704 A1     Dec. 2, 2021

(30) Foreign Application Priority Data

Oct. 13, 2017    (CN) .......................... 201710956647.5

(51) Int. Cl.
*G06F 3/044*         (2006.01)
(52) U.S. Cl.
CPC .. *G06F 3/0443* (2019.05); *G06F 2203/04103* (2013.01); *G06F 2203/04112* (2013.01)
(58) Field of Classification Search
None
See application file for complete search history.

(56) References Cited

U.S. PATENT DOCUMENTS

2015/0109540 A1    4/2015   Chang et al.
2016/0216464 A1*   7/2016   Tsujita .................. G02B 6/428
(Continued)

FOREIGN PATENT DOCUMENTS

CN       103941895 A      7/2014
CN       105117081 A     12/2015
(Continued)

OTHER PUBLICATIONS

First Office Action for Chinese Application No. 201710956647.5, dated Apr. 2, 2019, 7 Pages.
(Continued)

*Primary Examiner* — Amare Mengistu
*Assistant Examiner* — Sarvesh J Nadkarni
(74) *Attorney, Agent, or Firm* — Brooks Kushman P.C.

(57) ABSTRACT

Embodiments of the present disclosure provide a touch control substrate, a method for manufacturing the same and a display device. The touch control substrate includes a base and touch wiring lines on the base. The touch wiring line includes a plurality of hollowed patterns defined by a plurality of metal lines.

13 Claims, 3 Drawing Sheets

(56) References Cited

U.S. PATENT DOCUMENTS

| | | | |
|---|---|---|---|
| 2017/0060281 A1 | 3/2017 | Xie et al. | |
| 2017/0075449 A1 | 3/2017 | Ko et al. | |
| 2017/0185201 A1 | 6/2017 | Ding et al. | |
| 2017/0256599 A1* | 9/2017 | Kim | H01L 27/1218 |
| 2017/0352717 A1* | 12/2017 | Choi | H01L 27/3276 |
| 2019/0187843 A1* | 6/2019 | Ye | G06F 3/041 |
| 2020/0081579 A1* | 3/2020 | Wang | G06F 3/0443 |

FOREIGN PATENT DOCUMENTS

| | | | |
|---|---|---|---|
| CN | 105183219 A | 12/2015 | |
| CN | 106249979 A | 12/2016 | |
| CN | 106371666 A | 2/2017 | |
| CN | 107622990 A | 1/2018 | |

OTHER PUBLICATIONS

International Search Report and Written Opinion for Application No. PCT/CN2018/109782, dated Dec. 28, 2018, 10 Pages.

\* cited by examiner

DISPLAY DEVICE WITH TOUCH CONTROL WIRING LIENS HAVING HOLE PATTERNS AND METHOD OF MANUFACTURING THEREOF

CROSS-REFERENCE TO RELATED APPLICATION APPLICATIONS

This application is the U.S. national phase of PCT Application No. PCT/CN2018/109782 filed on Oct. 11, 2018, which claims priority to Chinese Patent Application No. 201710956647.5 filed on Oct. 13, 2017, which are incorporated herein by reference in their entireties.

TECHNICAL FIELD

The present disclosure relates to the field of display technologies, and in particular to a touch control substrate, a method for manufacturing the same and a display device.

BACKGROUND

As rapid development of display technologies, touch screens are widely used. According to different induction modes, the touch screens may be divided into four types including resistance type, capacitance type infrared type and acoustic type. The capacitance type touch screen has become the mainstream of the touch screen market and the future development trend.

Currently, the capacitance type touch screen includes touch electrodes and touch wiring lines. The touch electrodes are arranged on an array substrate or a color substrate. The touch wiring lines are distributed at a periphery of the touch screen. Each touch electrode is needed to be connected with the touch wiring line. However, the touch wiring lines in the capacitance type touch screen in the related art occupies a large area, which cannot meet design requirements of narrow-bezel products.

SUMMARY

According to one aspect, one embodiment of the present disclosure provides a touch control substrate including a base and touch wiring lines on the base. The touch wiring line includes a plurality of hollowed patterns.

Optionally, the touch wiring line includes a metal mesh structure and a plurality of holes defined in the metal mesh structure; and the plurality of holes are the hollowed patterns.

Optionally, the touch wiring line is made of metal.

Optionally, the touch wiring line includes a first metal layer; and the first metal layer includes a plurality of hollowed patterns.

Optionally, the touch wiring line includes a first metal layer, a transparent conductive layer and a second metal layer; each of the first metal layer and the second metal layer includes a plurality of hollowed patterns; the first metal layer is on the base; and the transparent conductive layer and the second metal layer are sequentially disposed at one side of the first metal layer distal to the base.

Optionally, the touch control substrate further includes an insulation layer and a touch control layer. The insulation layer is at one side of the touch wiring line distal to the base; the touch control layer is on the insulation layer, and is coupled with the touch wiring lines through via holes in the insulation layer.

Optionally, the hollowed patterns include one or more of triangle, quadrilateral, hexagon, circle or ellipse.

Optionally, a line width of each of the first metal layer and the second metal layer is in a range of from 4 micrometers to 6 micrometers.

Optionally, the transparent conductive layer is made of indium tin oxide.

Optionally, the insulation layer is made of negative photoresist; and the touch control layer is made of indium tin oxide.

According to another aspect, one embodiment of the present disclosure provides a display device including the above touch control substrate.

According to another aspect, one embodiment of the present disclosure provides a method for manufacturing a touch control substrate, including: providing a base; and forming touch wiring lines on the base with the touch wiring lines including a plurality of hollowed patterns.

Optionally, the forming touch wiring lines on the base with the touch wiring lines including a plurality of hollowed patterns specifically includes: depositing a first metal film on the base; forming a first metal layer including hollowed patterns defined by a plurality of wiring lines through a patterning process.

Optionally, the forming touch wiring lines on the base with the touch wiring lines including a plurality of hollowed patterns specifically includes: depositing a first metal film on the base; forming a first metal layer including hollowed patterns defined by a plurality of wiring lines through a patterning process; depositing a first transparent conductive film on the first metal layer; forming a transparent conductive layer through a patterning process; depositing a second metal film on the transparent conductive layer; and forming a second metal layer including hollowed patterns defined by a plurality of wiring lines through a patterning process.

Optionally, after the forming touch wiring lines on the base with the touch wiring lines including a plurality of hollowed patterns, the method further includes: coating an insulation film on the touch wiring lines; and forming an insulation layer by etching the insulation film.

Optionally, after the forming an insulation layer by etching the insulation film, the method further includes: forming via holes in the insulation layer.

Optionally, after the forming via holes in the insulation layer, the method further includes: depositing a second transparent conductive film on the insulation layer; and forming a touch control layer through a patterning process.

BRIEF DESCRIPTION OF THE DRAWINGS

The drawings are used to provide a further understanding of the technical solutions of the present disclosure, and constitute a part of the specification. The drawings together with the embodiments of the present application are used to explain the technical solutions of the present disclosure, and do not constitute a limitation of the technical solutions of the present disclosure.

DETAILED DESCRIPTION

In order to make the objects, the technical solutions and the advantages of the present disclosure more apparent, the present disclosure will be described hereinafter in a clear and complete manner in conjunction with the drawings and embodiments. It should be noted that, in the case of no conflict, embodiments and features in the embodiments in the present application may be combined with each other.

Unless otherwise defined, any technical or scientific terms used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof.

Currently, one touch screen in the related art usually includes a touch region and a border region. Several touch electrodes are disposed at the touch region. Several touch wiring lines are disposed at the border region which is at a periphery of the touch screen, and are connected with input terminals of the touch electrodes. Each touch electrode is needed to be connected with the touch wiring line.

By taking one 5.5-inch touch screen as an example, distribution of the border region of the touch screen is illustrated. The border region occupies 1.1 mm in total, which specifically includes 0.6 mm occupies by touch wiring lines, a distance of 0.2 mm from periphery ground lines to edges and 0.3 mm occupied by a cover plate. The cover plate is used to prevent explosion of the touch wiring lines which may result in problems that the touch wiring lines are visually visible.

Inventors of the present application found that the touch wiring line in the related art is usually a strip-shaped solid metal wiring line, but a line width of the touch wiring line cannot be extremely narrow due to accuracy requirements of related devices. Generally speaking, a line width of a single touch wiring line is in a range of from 20 microns to 30 microns, which results in that several touch wiring lines distributed at a periphery of the touch screen will occupy a larger area. Then, in order to solve the problem of visual visibility of the touch wiring lines, a cover plate is required in the touch screen in the related art, which results in that the touch screen in the related art cannot meet design requirements of narrow-bezel products.

In order to solve the technical problem that the touch screen in the related art cannot meet design requirements of narrow-bezel products due to visibility of the touch wiring lines, embodiments of the present disclosure provide a touch control substrate, a method for manufacturing the same and a display device.

Figure 1:
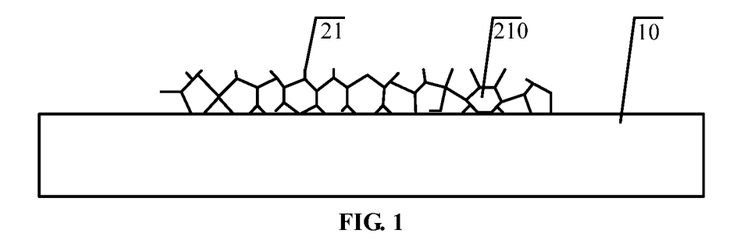
FIG. 1 is a schematic view of a touch control substrate according to some embodiments of the present disclosure.

FIG. 1 is a schematic view of a touch control substrate according to some embodiments of the present disclosure. As shown in FIG. 1, the touch control substrate provided in some embodiments of the present disclosure includes a base 10 and touch wiring lines disposed on the base 10. The touch wiring lines include a plurality of hollowed patterns defined by a plurality of metal lines.

Optionally, the base 10 may be a flexible base. In other words, the base is made of flexible material, such as polyimide. The base 10 may also be made of materials such as glass and plastic, which are not limited thereto in the present disclosure.

Optionally, the touch wiring line includes a first metal layer 21. The first metal layer 21 includes hollowed patterns 210 defined by a plurality of metal lines.

Optionally, the first metal layer 21 may be made of metal materials such as copper, iron, aluminum and molybdenum, and then the touch wiring line has good conductivity. The present disclosure does not limit materials of the first metal layer.

Optionally, a line width of the first metal layer 21 is in a range of from 4 micrometers to 6 micrometers.

Optionally, the hollowed patterns 210 include one or more of triangle, quadrilateral, hexagon, circle or ellipse. In other words, patterns of the various hollowed patterns of the touch wiring lines may be all the same, or may be all different, or may be partially the same, which are not limited in the present disclosure. FIG. 1 shows an example in which patterns of some of the various hollowed patterns of the touch wiring lines are the same.

Specifically, the touch control substrate includes a touch region and a border region. The touch wiring lines are disposed at the border region. The touch region is absent of a layer of metal wiring lines and only the border region is provided with the touch wiring lines, thereby avoiding the problem of metal shadowing. It should be noted that the touch electrodes are coupled with a flexible printed circuit board through the touch wiring lines.

Specifically, the various hollowed patterns in the touch wiring line are arranged along an extension direction of the touch wiring line in an arrange mode which may include a sequential arrangement mode and a misaligned arrangement mode. It should be noted that the various hollowed patterns are arranged at intervals and the interval between adjacent two hollowed patterns may be set according to specific situations. Patterns of the various hollowed patterns sequentially arranged along the extension direction of the touch wiring line may be the same or may be different. In some embodiments, the patterns of the various hollowed patterns sequentially arranged along the extension direction of the touch wiring line are the same, thereby facilitating fabrication of the touch wiring line.

The touch control substrate provided in some embodiments of the present disclosure includes the base and the touch wiring lines disposed on the base, and the touch wiring lines include a plurality of hollowed patterns defined by a plurality of metal lines. In the technical solution of the embodiments of the present disclosure, the touch wiring lines include a plurality of hollowed patterns defined by a plurality of metal lines, thereby enabling the width of the touch wiring line to be smaller and then reducing an area occupied by the touch wiring line. Then, even if the touch wiring line is exposed, it is almost impossible to distinguish for human eyes, thereby solving the problem that the touch wiring lines are visually visible. Thus, there is no need to provide a cover plate on the touch screen to prevent explosion of the touch wiring lines, thereby meeting design requirements of narrow-bezel touch screen.

Figure 2:
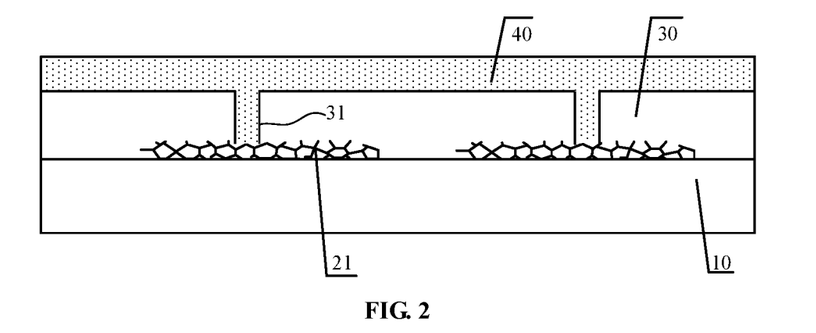
FIG. 2 is another schematic view of a touch control substrate according to some embodiments of the present disclosure.

Optionally, FIG. 2 is another schematic view of a touch control substrate according to some embodiments of the present disclosure. As shown in FIG. 2, the touch control substrate further includes an insulation layer 30 and a touch control layer 40.

Specifically, the insulation layer 30 is disposed at one side of the touch wiring line distal to the base 10. The touch control layer 40 is disposed at the insulation layer 30, and is coupled with the touch wiring lines through via holes 31 in the insulation layer 30.

Optionally, the insulation layer 30 may be made of material such as organic OC material. The organic OC material may be negative photoresist.

Optionally, the touch control layer 40 may be made of material such as indium tin oxide.

In some embodiments of the present disclosure, the presence of the insulation layer and the touch control layer on the touch wiring lines can realize not only the visual invisibility of the touch wiring lines distributed at a periphery of the touch screen, but also the touch control function, thereby achieving effects that one display screen has no bezel on vision and touch control and then meeting design requirements of narrow-bezel products.

Figure 3:
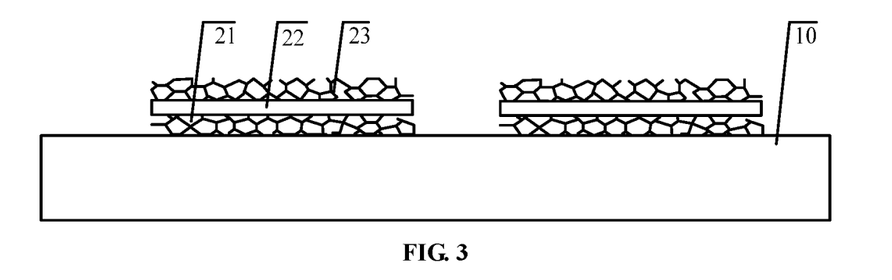
FIG. 3 is a schematic view of a touch control substrate according to some embodiments of the present disclosure.

FIG. 3 is a schematic view of a touch control substrate according to some embodiments of the present disclosure. As shown in FIG. 3, the touch control substrate provided in some embodiments of the present disclosure includes a base 10 and touch wiring lines disposed on the base 10. The touch wiring lines include a plurality of hollowed patterns defined by a plurality of metal lines.

The base 10 may be a flexible base. In other words, the base is made of flexible material, such as polyimide. The base 10 may also be made of materials such as glass and plastic, which are not limited thereto in the present disclosure.

Optionally, the touch wiring line includes a first metal layer 21, a transparent conductive layer 22 and a second metal layer 23.

Each of the first metal layer 21 and the second metal layer 23 includes hollowed patterns 210 defined by a plurality of metal lines. The transparent conductive layer 22 and the second metal layer 23 are sequentially disposed at one side of the first metal layer 21 distal to the base 10. In the embodiment shown in FIG. 3, the first metal layer 21 and the second metal layer 23 are disposed at two sides of the transparent conductive layer 22. In other words, the transparent conductive layer 22 is sandwiched between the first metal layer 21 and the second metal layer 23.

Optionally, the first metal layer 21 may be made of metal materials such as copper, iron, aluminum and molybdenum, and the second metal layer 23 may be made of metal materials such as copper, iron, aluminum and molybdenum. It should be noted that materials of the first metal layer 21 and the second metal layer 23 may be the same or different, which are not limited in the present disclosure.

In one embodiment, the touch wiring line includes the first metal layer and the second metal layer, and such an arrangement enables the touch wiring line to have good conductivity, which is not limited in the present disclosure.

Optionally, a line width of the first metal layer 21 is in a range of from 4 micrometers to 6 micrometers. A line width of the second metal layer 23 is in a range of from 4 micrometers to 6 micrometers. It should be noted that the line widths of the first metal layer 21 and the second metal layer 23 may be the same or different, which are not limited in the present disclosure.

Optionally, the transparent conductive layer 22 may be made of material such as indium tin oxide.

In some embodiments of the present disclosure, the touch wiring line with three-layer structure of the first metal layer, the transparent conductive layer and the second metal layer can improve problems that resistance values of the touch wiring line is increased due to the thinning of the touch wiring line.

Optionally, the hollowed patterns include one or more of triangle, quadrilateral, hexagon, circle or ellipse. In other words, patterns of the various hollowed patterns of the touch wiring lines may be all the same, or may be all different, or may be partially the same, which are not limited in the present disclosure. FIG. 3 shows an example in which patterns of some of the various hollowed patterns of the touch wiring lines are the same.

Specifically, the touch control substrate includes a touch region and a border region. The touch wiring lines are disposed at the border region. The touch region is absent of a layer of metal wiring lines and only the border region is provided with the touch wiring lines, thereby avoiding the problem of metal shadowing. It should be noted that the touch electrodes are coupled with a flexible printed circuit board through the touch wiring lines.

Specifically, the various hollowed patterns in the touch wiring line are arranged along an extension direction of the touch wiring line in an arrange mode which may include a sequential arrangement mode and a misaligned arrangement mode. It should be noted that the various hollowed patterns are arranged at intervals and the interval between adjacent two hollowed patterns may be set according to specific situations. Patterns of the various hollowed patterns sequentially arranged along the extension direction of the touch wiring line may be the same or may be different. In some embodiments, the patterns of the various hollowed patterns sequentially arranged along the extension direction of the touch wiring line are the same, thereby facilitating fabrication of the touch wiring line.

The touch control substrate provided in some embodiments of the present disclosure includes the base and the touch wiring lines disposed on the base, and the touch wiring lines include a plurality of hollowed patterns defined by a plurality of metal lines. In the technical solution of the embodiments of the present disclosure, the touch wiring lines include a plurality of hollowed patterns defined by a plurality of metal lines, thereby enabling the width of the touch wiring line to be smaller and then reducing an area occupied by the touch wiring line. Then, even if the touch wiring line is exposed, it is almost impossible to distinguish for human eyes, thereby solving the problem that the touch wiring lines are visually visible. Thus, there is no need to provide a cover plate on the touch screen to prevent explosion of the touch wiring lines, thereby meeting design requirements of narrow-bezel touch screen.

Figure 4:
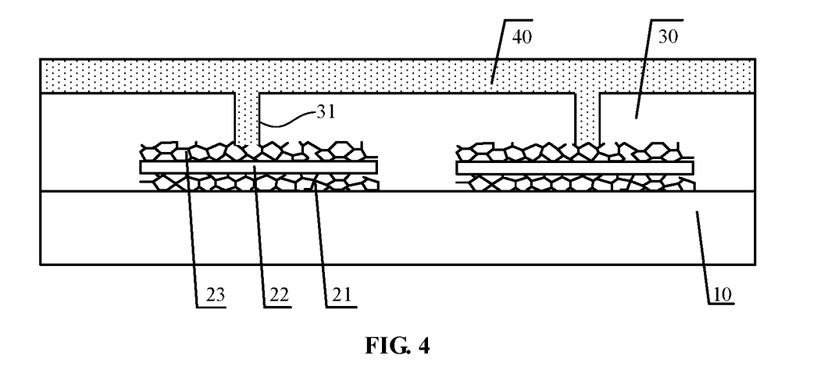
FIG. 4 is another schematic view of a touch control substrate according to some embodiments of the present disclosure.

Optionally, FIG. 4 is another schematic view of a touch control substrate according to some embodiments of the present disclosure. As shown in FIG. 4, the touch control substrate further includes an insulation layer 30 and a touch control layer 40.

Specifically, the insulation layer 30 is disposed at one side of the touch wiring line distal to the base 10. The touch control layer 40 is disposed at the insulation layer 30, and is coupled with the touch wiring lines through via holes 31 in the insulation layer 30.

Optionally, the insulation layer 30 may be made of material such as organic OC material. The organic OC material may be negative photoresist.

Optionally, the touch control layer 40 may be made of material such as indium tin oxide.

In some embodiments of the present disclosure, the presence of the insulation layer and the touch control layer on the touch wiring lines can realize not only the visual invisibility of the touch wiring lines distributed at a periphery of the touch screen, but also the touch control function, thereby achieving effects that one display screen has no bezel on vision and touch control and then meeting design requirements of narrow-bezel products.

Figure 5:
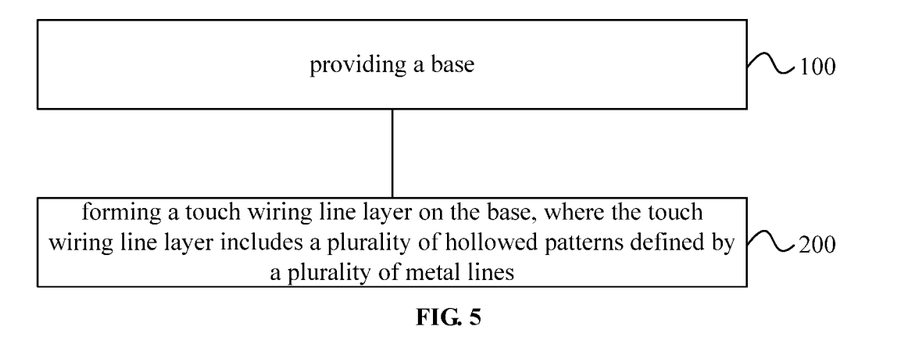
FIG. 5 is a flow chart of a method for manufacturing the touch control substrate according to some embodiments of the present disclosure.

Based on the inventive concept of the embodiment shown in FIG. 1, FIG. 5 is a flow chart of a method for manufacturing the touch control substrate according to some embodiments of the present disclosure. As shown in FIG. 5, the method for manufacturing the touch control substrate specifically includes the following steps.

A step 100 is to provide a base.

Optionally, the base may be a flexible base. In other words, the base is made of flexible material, such as polyimide. The base may also be made of materials such as glass and plastic, which are not limited thereto in the present disclosure.

A step 200 is to form touch wiring lines on the base, where the touch wiring lines include a plurality of hollowed patterns defined by a plurality of metal lines.

Specifically, the step 200 includes: depositing a first metal film on the base; and forming a first metal layer including hollowed patterns defined by a plurality of metal lines through a patterning process.

Optionally, the first metal film may be made of metal materials such as copper, iron, aluminum and molybdenum, and then the touch wiring line has good conductivity. The present disclosure does not limit materials of the first metal film.

Specifically, the first metal film may be deposited by a chemical vapor deposition (CVD) process, an evaporation process or a sputtering process.

Optionally, a line width of the first metal layer is in a range of from 4 micrometers to 6 micrometers.

Optionally, the hollowed patterns include one or more of triangle, quadrilateral, hexagon, circle or ellipse. In other words, patterns of the various hollowed patterns of the touch wiring lines may be all the same, or may be all different, or may be partially the same, which are not limited in the present disclosure.

Specifically, the patterning process includes: photoresist coating, exposure, development, etching, and stripping. It should be noted that the patterning process uses mask plates for forming touch wiring lines in the related art. In other words, the method provided in some embodiments of the present disclosure does not increase the quantity of mask plates, i.e., not increasing complexity of the production process.

Specifically, the various hollowed patterns in the touch wiring line are arranged along an extension direction of the touch wiring line in an arrange mode which may include a sequential arrangement mode and a misaligned arrangement mode. It should be noted that the various hollowed patterns are arranged at intervals and the interval between adjacent two hollowed patterns may be set according to specific situations. Patterns of the various hollowed patterns sequentially arranged along the extension direction of the touch wiring line may be the same or may be different. In some embodiments, the patterns of the various hollowed patterns sequentially arranged along the extension direction of the touch wiring line are the same, thereby facilitating fabrication of the touch wiring line.

The method provided in some embodiments of the present disclosure includes providing the base and depositing the touch wiring lines on the base, where the touch wiring lines include a plurality of hollowed patterns defined by a plurality of metal lines. In the technical solution of the embodiments of the present disclosure, the touch wiring lines include a plurality of hollowed patterns defined by a plurality of metal lines, thereby enabling the width of the touch wiring line to be smaller and then reducing an area occupied by the touch wiring line. Then, even if the touch wiring line is exposed, it is almost impossible to distinguish for human eyes, thereby solving the problem that the touch wiring lines are visually visible. Thus, there is no need to provide a cover plate on the touch screen to prevent explosion of the touch wiring lines, thereby meeting design requirements of narrow-bezel touch screen.

Optionally, after the step 200, the method for manufacturing the touch control substrate provided in some embodiments of the present disclosure further includes: coating an insulation film on the touch wiring lines; and forming an insulation layer by etching the insulation film.

Optionally, the insulation layer may be made of material such as organic OC material. The organic OC material may be negative photoresist.

Optionally, after the forming an insulation layer by etching the insulation film, the method further includes: forming via holes in the insulation layer.

Optionally, after the forming via holes in the insulation layer, the method further includes: depositing a second transparent conductive film on the insulation layer; and forming a touch control layer through a patterning process.

Optionally, the second transparent conductive film may be made of material such as indium tin oxide.

In some embodiments of the present disclosure, the presence of the insulation layer and the touch control layer on the touch wiring lines can realize not only the visual invisibility of the touch wiring lines distributed at a periphery of the touch screen, but also the touch control function, thereby achieving effects that one display screen has no bezel on vision and touch control and then meeting design requirements of narrow-bezel products.

Figure 6A:
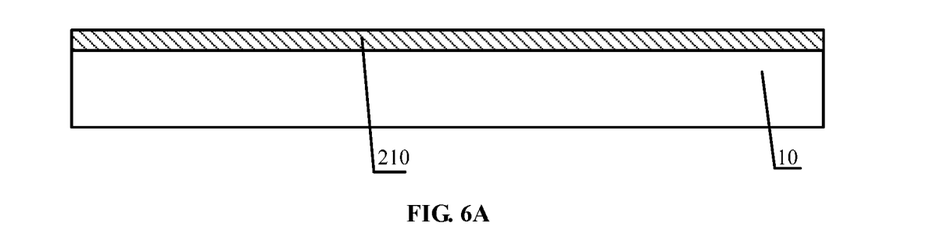
FIG. 6A is a first schematic diagram of the method for manufacturing the touch control substrate according to some embodiments of the present disclosure.
Figure 6B:
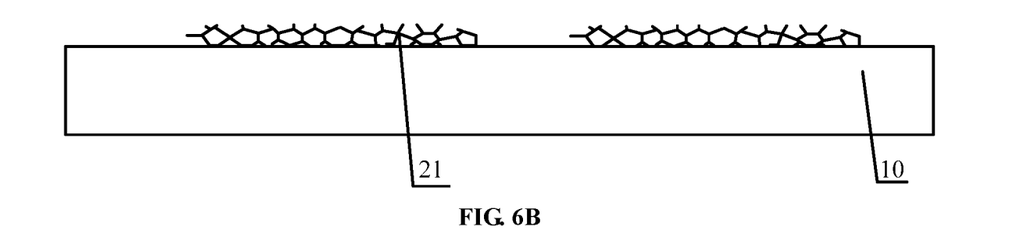
FIG. 6B is a second schematic diagram of the method for manufacturing the touch control substrate according to some embodiments of the present disclosure.
Figure 6C:
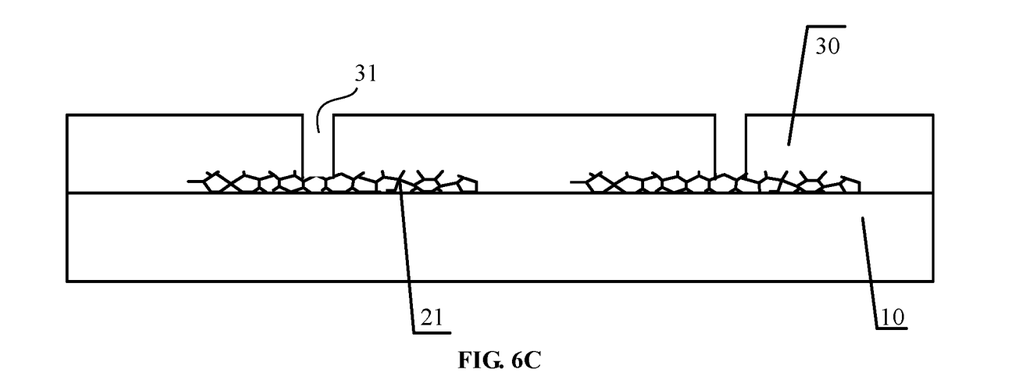
FIG. 6C is a third schematic diagram of the method for manufacturing the touch control substrate according to some embodiments of the present disclosure.

The method for manufacturing the touch control substrate according to some embodiments of the present disclosure is further described in details in conjunctions with FIG. 6A to FIG. 6C. The patterning process includes steps such as photoresist coating, exposure, development, etching, and stripping.

A step 301 is to provide a base 10 and deposit a first metal film 210 on the base 10, as shown in FIG. 6A.

Specifically, the first metal film may be deposited by a CVD process, an evaporation process or a sputtering process.

The base 10 may be a flexible base. In other words, the base is made of flexible material, such as polyimide. The base may also be made of materials such as glass and plastic.

Optionally, the first metal film 210 may be made of metal materials such as copper, iron, aluminum and molybdenum.

A step 302 is to form a first metal layer 21 including hollowed patterns by processing the first metal film 210 through a patterning process, as shown in FIG. 6B.

Optionally, a line width of the first metal layer 21 is in a range of from 4 micrometers to 6 micrometers.

A step 303 is to coat an insulation film on the first metal layer 21; form an insulation layer 30 by etching the insulation film, and form via holes 31 in the insulation layer 30, as shown in FIG. 6C.

Optionally, the insulation film may be made of material such as organic OC material. The organic OC material may be negative photoresist.

A step 304 is to deposit a second transparent conductive film on the insulation layer 30, and form a touch control layer 40 through a patterning process, as shown in FIG. 2.

Specifically, the second transparent conductive film may be deposited by a CVD process, an evaporation process or a sputtering process.

Optionally, the second transparent conductive film may be made of material such as indium tin oxide.

Based on the inventive concept of the embodiment shown in FIG. 3, a method for manufacturing the touch control substrate according to some embodiments of the present disclosure is provided. The method for manufacturing the touch control substrate specifically includes the following steps.

A step 100 is to provide a base.

Optionally, the base may be a flexible base. In other words, the base is made of flexible material, such as polyimide. The base may also be made of materials such as glass and plastic, which are not limited thereto in the present disclosure.

A step 200 is to form touch wiring lines on the base, where the touch wiring lines include a plurality of hollowed patterns defined by a plurality of metal lines.

Specifically, the step 200 includes: depositing a first metal film on the base; forming a first metal layer including hollowed patterns defined by a plurality of metal lines through a patterning process; depositing a first transparent conductive film on the first metal layer; forming a transparent conductive layer through a patterning process; depositing a second metal film on the transparent conductive layer; and forming a second metal layer including hollowed patterns defined by a plurality of metal lines through a patterning process.

Optionally, the first metal film may be made of metal materials such as copper, iron, aluminum and molybdenum, and the second metal film may be made of metal materials such as copper, iron, aluminum and molybdenum. It should be noted that materials of the first metal film and the second metal film may be the same or different, which are not limited in the present disclosure.

Specifically, the first metal film, the first transparent conductive film and the second metal film may be deposited by a chemical vapor deposition (CVD) process, an evaporation process or a sputtering process.

Optionally, a line width of the first metal layer is in a range of from 4 micrometers to 6 micrometers. A line width of the second metal layer is in a range of from 4 micrometers to 6 micrometers. It should be noted that the line widths of the first metal layer and the second metal layer may be the same or different, which are not limited in the present disclosure.

Optionally, the transparent conductive layer may be made of material such as indium tin oxide.

In some embodiments of the present disclosure, the touch wiring line with three-layer structure of the first metal layer, the transparent conductive layer and the second metal layer can improve problems that resistance values of the touch wiring line is increased due to the thinning of the touch wiring line.

Optionally, the hollowed patterns include one or more of triangle, quadrilateral, hexagon, circle or ellipse. In other words, patterns of the various hollowed patterns of the touch wiring lines may be all the same, or may be all different, or may be partially the same, which are not limited in the present disclosure.

Specifically, the patterning process includes: photoresist coating, exposure, development, etching, and stripping. It should be noted that the patterning process uses mask plates for forming touch wiring lines in the related art. In other words, the method provided in some embodiments of the present disclosure does not increase the quantity of mask plates, i.e., not increasing complexity of the production process.

Specifically, the various hollowed patterns in the touch wiring line are arranged along an extension direction of the touch wiring line in an arrange mode which may include a sequential arrangement mode and a misaligned arrangement mode. It should be noted that the various hollowed patterns are arranged at intervals and the interval between adjacent two hollowed patterns may be set according to specific situations. Patterns of the various hollowed patterns sequentially arranged along the extension direction of the touch wiring line may be the same or may be different. In some embodiments, the patterns of the various hollowed patterns sequentially arranged along the extension direction of the touch wiring line are the same, thereby facilitating fabrication of the touch wiring line.

The method provided in some embodiments of the present disclosure includes providing the base and depositing the touch wiring lines on the base, where the touch wiring lines include a plurality of hollowed patterns defined by a plurality of metal lines. In the technical solution of the embodiments of the present disclosure, the touch wiring lines include a plurality of hollowed patterns defined by a plurality of metal lines, thereby enabling the width of the touch wiring line to be smaller and then reducing an area occupied by the touch wiring line. Then, even if the touch wiring line is exposed, it is almost impossible to distinguish for human eyes, thereby solving the problem that the touch wiring lines are visually visible. Thus, there is no need to provide a cover plate on the touch screen to prevent explosion of the touch wiring lines, thereby meeting design requirements of narrow-bezel touch screen.

Optionally, after the step 200, the method for manufacturing the touch control substrate provided in some embodiments of the present disclosure further includes: coating an insulation film on the touch wiring lines; and forming an insulation layer by etching the insulation film.

Optionally, the insulation layer may be made of material such as organic OC material. The organic OC material may be negative photoresist.

Optionally, after the forming an insulation layer by etching the insulation film, the method further includes: forming via holes in the insulation layer.

Optionally, after the forming via holes in the insulation layer, the method further includes: depositing a second transparent conductive film on the insulation layer; and forming a touch control layer through a patterning process.

Optionally, the second transparent conductive film may be made of material such as indium tin oxide.

In some embodiments of the present disclosure, the presence of the insulation layer and the touch control layer on the touch wiring lines can realize not only the visual invisibility of the touch wiring lines distributed at a periphery of the touch screen, but also the touch control function, thereby achieving effects that one display screen has no bezel on vision and touch control and then meeting design requirements of narrow-bezel products.

The method for manufacturing the touch control substrate according to some embodiments of the present disclosure is further described in details in conjunctions with FIG. 7A to FIG. 7D. The patterning process includes steps such as photoresist coating, exposure, development, etching, and stripping.

Figure 7A:
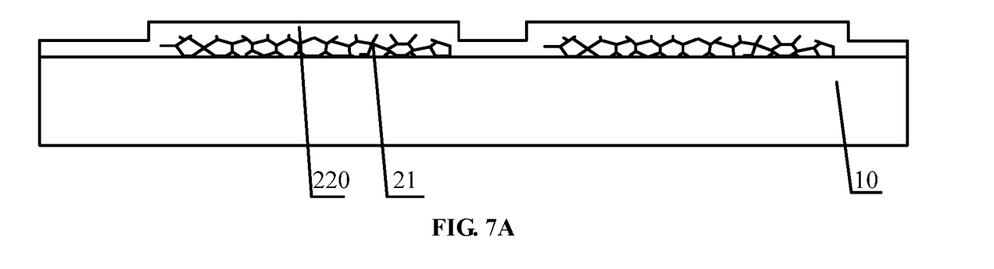
FIG. 7A is a first schematic diagram of the method for manufacturing the touch control substrate according to some embodiments of the present disclosure.

A step 401 is to provide a base 10 and form a first metal layer 21 including hollowed patterns on the base 10.

Specifically, the step 401 is the same as the steps 301-302 of the embodiment shown in FIG. 5, and is not elaborated herein.

A step 402 is to deposit a first transparent conductive film 220 on the first metal layer 21, where the first transparent conductive film covers the entire base 10, as shown in FIG. 7A.

Specifically, the first transparent conductive film may be deposited by a CVD process, an evaporation process or a sputtering process.

Optionally, the first transparent conductive film may be made of material such as indium tin oxide.

Figure 7B:
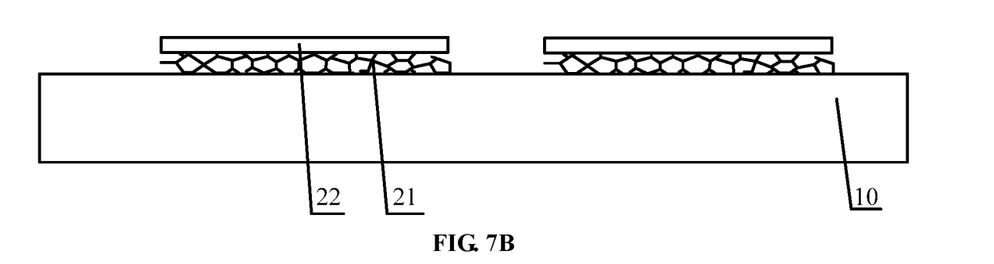
FIG. 7B is a second schematic diagram of the method for manufacturing the touch control substrate according to some embodiments of the present disclosure.

A step 403 is to form a transparent conductive layer 22 by processing the first transparent conductive film 220 through a patterning process, as shown in FIG. 7B.

Figure 7C:
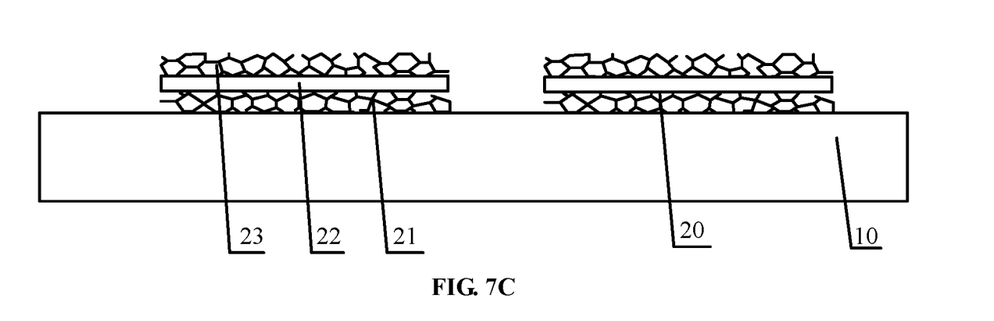
FIG. 7C is a third schematic diagram of the method for manufacturing the touch control substrate according to some embodiments of the present disclosure.

A step 404 is to deposit a second metal film on the transparent conductive layer 22; and form a second metal layer 23 through a patterning process, as shown in FIG. 7C.

Optionally, the second metal film may be made of metal materials such as copper, iron, aluminum and molybdenum. It should be noted that materials of the first metal film and the second metal film may be the same or different, which are not limited in the present disclosure.

Optionally, a line width of the second metal layer is in a range of from 4 micrometers to 6 micrometers. It should be noted that the line widths of the first metal layer and the second metal layer may be the same or different, which are not limited in the present disclosure.

Figure 7D:
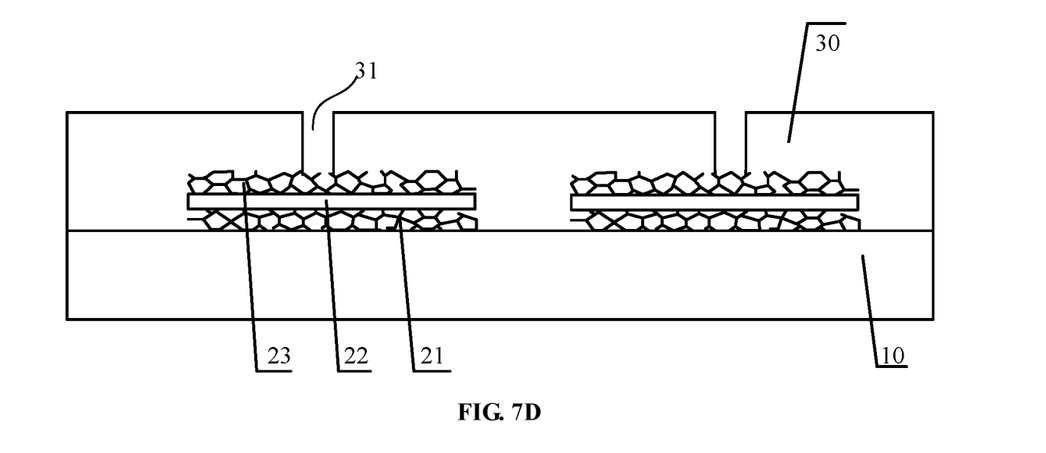
FIG. 7D is a fourth schematic diagram of the method for manufacturing the touch control substrate according to some embodiments of the present disclosure.

A step 405 is to coat an insulation film on the second metal layer 23; and form an insulation layer 30 by etching the insulation film, and dorm via holes 31 in the insulation layer 30, as shown in FIG. 7D.

Optionally, the insulation film may be made of material such as organic OC material. The organic OC material may be negative photoresist.

A step 406 is to deposit a second transparent conductive film on the insulation layer 30, and form a touch control layer 40 through a patterning process, as shown in FIG. 4.

Optionally, the second transparent conductive film may be deposited by a CVD process, an evaporation process or a sputtering process.

Optionally, the second transparent conductive film may be made of material such as indium tin oxide.

One embodiment of the present disclosure provides a display device. The display device includes a touch substrate.

The touch substrate is the touch substrate provided in the embodiment shown in FIG. 1 or FIG. 5, and their implementation principles and implementation effects are similar and will not be described herein.

Specifically, the display device may be any product or component having a display function, such as a mobile phone, a tablet computer, a television, a monitor, a notebook computer, a digital photo-frame and a navigator.

In the description of embodiments of the present disclosure, it should be noted that orientation or position relations indicated by terms such as "middle", "up", "down", "front", "rear", "vertical", "horizontal", "top", "bottom", "inside" and "outside" are based on orientation or position relations shown in the drawings, and are intended only to facilitate the description of the present disclosure and simplify the description, rather than indicating or implying that the referred device or element must have a specific orientation, be constructed and operated in a specific orientation, and therefore cannot be construed as a limitation of the present disclosure.

In the description of embodiments of the present disclosure, it should be noted that, unless otherwise specified and defined, the terms "installation", "connection" and "connected" should be understood broadly, such as fixed connection, removable connection or integrated connection, mechanical connection or electrical connection, direct connection or indirect connection through intermediaries, or internal connection of two components. For those skilled in the art, the specific meaning of the above terms in the present disclosure may be understood in specific circumstances.

Although the embodiments disclosed in the present disclosure are as above, the described contents are only the embodiments adopted for facilitating the understanding of the present disclosure, and are not intended to limit the present disclosure. Any person skilled in the art may make improvements and modifications in forms and details of implementations without departing from the principle of the present disclosure, and these improvements and modifications shall also fall within the scope of the present disclosure.

What is claimed is:

1. A touch control substrate comprising:
    a base;
    an insulation layer;
    a touch control layer; and
    at least one touch wiring line on the base;
    wherein the touch wiring line includes a plurality of hollowed patterns; and
    the insulation layer is at one side of the touch wiring line distal to the base; the touch control layer is on the insulation layer, and is coupled with the touch wiring lines through via holes in the insulation layer;
    wherein the touch wiring line includes a first metal layer, a transparent conductive layer and a second metal layer; each of the first metal layer and the second metal layer includes a plurality of hollowed patterns; the first metal layer is on the base; and the transparent conductive layer and the second metal layer are sequentially disposed at one side of the first metal layer distal to the base.

2. The touch control substrate of claim 1, wherein the touch wiring line includes a metal mesh structure and a plurality of holes defined in the metal mesh structure; and the plurality of holes are the hollowed patterns.

3. The touch control substrate of claim 2, wherein the touch wiring line is made of metal.

4. The touch control substrate of claim 1, wherein the touch wiring line includes a first metal layer; and the first metal layer includes a plurality of hollowed patterns.

5. The touch control substrate of claim 1, wherein the hollowed patterns include one or more of triangle, quadrilateral, hexagon, circle or ellipse.

6. The touch control substrate of claim 1, wherein a line width of each of the first metal layer and the second metal layer is in a range of from 4 micrometers to 6 micrometers.

7. The touch control substrate of claim 1, wherein the transparent conductive layer is made of indium tin oxide.

8. The touch control substrate of claim 1, wherein the insulation layer is made of negative photoresist; and the touch control layer is made of indium tin oxide.

9. A display device comprising the touch control substrate of claim 1.

10. A method for manufacturing a touch control substrate, comprising:
   providing a base; and
   forming touch wiring lines on the base with the touch wiring lines including a plurality of hollowed patterns;
   wherein the forming touch wiring lines on the base with the touch wiring lines including a plurality of hollowed patterns specifically includes:
   depositing a first metal film on the base;
   forming a first metal layer including hollowed patterns defined by a plurality of wiring lines through a patterning process;
   depositing a first transparent conductive film on the first metal layer;
   forming a transparent conductive layer through a patterning process;
   depositing a second metal film on the transparent conductive layer; and
   forming a second metal layer including hollowed patterns defined by a plurality of wiring lines through a patterning process.

11. The method of claim 10, wherein after the forming touch wiring lines on the base with the touch wiring lines including a plurality of hollowed patterns, the method further includes: coating an insulation film on the touch wiring lines; and forming an insulation layer by etching the insulation film.

12. The method of claim 11, wherein after the forming an insulation layer by etching the insulation film, the method further includes: forming via holes in the insulation layer.

13. The method of claim 12, wherein after the forming via holes in the insulation layer, the method further includes: depositing a second transparent conductive film on the insulation layer; and forming a touch control layer through a patterning process.

* * * * *